(12) United States Patent
Sundblad

(10) Patent No.: US 7,649,394 B2
(45) Date of Patent: Jan. 19, 2010

(54) LATCH CIRCUIT

(75) Inventor: Rolf Sundblad, Ljungsbro (SE)

(73) Assignee: Zoran Corporation, Sunnyvale, CA (US)

( * ) Notice: Subject to any disclaimer, the term of this patent is extended or adjusted under 35 U.S.C. 154(b) by 0 days.

(21) Appl. No.: 12/279,392

(22) PCT Filed: Jan. 18, 2007

(86) PCT No.: PCT/EP2007/050506

§ 371 (c)(1),
(2), (4) Date: Aug. 14, 2008

(87) PCT Pub. No.: WO2007/093477

PCT Pub. Date: Aug. 23, 2007

(65) Prior Publication Data

US 2009/0066387 A1    Mar. 12, 2009

(30) Foreign Application Priority Data

Feb. 17, 2006  (EP)  ................... 06110117

(51) Int. Cl.
*H03K 3/00* (2006.01)

(52) U.S. Cl. ............... 327/199; 327/203; 327/215

(58) Field of Classification Search .......... 327/199, 327/200, 203, 208, 214, 215, 55, 57, 63, 327/64, 67
See application file for complete search history.

(56) References Cited

U.S. PATENT DOCUMENTS 4,110,641 A * 8/1978 Payne ..................... 327/67
5,448,200 A * 9/1995 Fernandez et al. ........... 327/560
5,621,340 A   4/1997 Lee et al.
5,929,661 A * 7/1999 Lee ........................ 327/63
6,608,503 B2 * 8/2003 Shenai et al. .............. 327/77
2002/0175727 A1  11/2002 Cyrusian

FOREIGN PATENT DOCUMENTS

EP    0 407 859 B1    1/1991

OTHER PUBLICATIONS

International Search Report corresponding to PCT/EP2007/050506, mailing date of May 22, 2007.
International Preliminary Report on Patentability corresponding to PCT/EP2007/050506, mailing date of May 22, 2007.

* cited by examiner

*Primary Examiner*—Hai L Nguyen
(74) *Attorney, Agent, or Firm*—Renner, Otto, Boisselle & Sklar, LLP

(57) ABSTRACT

A latch circuit (1) comprising a first input device (10a) in a first branch (4a) and a second input device (10b) in a second branch (4b). The latch circuit comprises a first estimator unit (40a) adapted to generate a first estimate of a current generated by the first input device (10a) and a second estimator unit (40b) adapted to generate a second estimate of a current generated by the second input device (10b). The latch circuit further comprises a control-voltage unit (50) operatively connected to the first and the second estimator unit (40a, 40b). The control-voltage unit is adapted to generate a control voltage based on a sum of the first estimate and the second estimate. Further, the latch circuit (1) comprises a first and a second voltage-controlled current unit (30a, 30b) adapted to generate currents at least based on the control voltage. The first voltage-controlled current unit (30a) is operatively connected to the first branch (4a). The second voltage-controlled current unit (30b) is operatively connected to the second branch (4b). A method for compensation for common-mode variations in the latch circuit (1) is also disclosed.

19 Claims, 4 Drawing Sheets

LATCH CIRCUIT

TECHNICAL FIELD OF THE INVENTION

The present invention relates to a latch device and a method for operating a latch device.

DESCRIPTION OF RELATED ART

A comparator is normally used for comparing a first analog value input to the comparator with a second analog value input to the comparator. Comparators may e.g. be used in an analog-to-digital converter (ADC) for comparing an analog input of the ADC with a plurality of reference levels. The output of the comparator may be a voltage adopting a first level corresponding to a first digital value, e.g. a '0', if the first analog value is smaller than the second analog value, and a second level corresponding to a second digital value, e.g. a '1', if the first analog value is larger than the second analog value.

To obtain a robust design, requirements are normally set on separation of the voltage levels representing digital values. For example, such requirements may state that a voltage representing a '0' must be smaller than $0.2V_{DD}$ and a voltage representing a '1' must be larger than $0.8V_{DD}$, where $V_{DD}$ is a supply voltage. To obtain such separation at the output of a comparator, an output stage in the form of a latch device may be used. The latch device may have a differential structure comprising a first branch and a second branch. The latch device may include at least one cross-coupled transistor pair in a positive-feedback configuration.

During a reset phase of the latch device, the two branches may be balanced e.g. by connecting a node of the first branch to a corresponding node of the second branch, e.g. using a switch.

During a latch phase of the latch device, the balancing of the branches may be removed, e.g. by opening the switch. Differences in the electrical conditions of the two branches, e.g. caused by differences between the first and the second analog values input to the comparator, may be amplified by the cross-coupled transistor pair. The latch device may have a differential output where each of the first branch and the second branch has an associated output terminal. An output voltage from the latch may be the difference between voltages at the output terminals associated with the first and the second branches. Alternatively, the latch device may have a single-ended output, where only one of the first branch and the second branch has an associated output terminal.

The latch device should amplify differences between analog signals input to the latch device. A disadvantage with known latch devices is that they may be sensitive to common-mode variations in the analog signals input to the latch device. For example, common-mode variations in the input signal may result in that the operating point of the output voltage of the latch device during the reset phase is significantly altered. This may in turn e.g. result in malfunction of the latch device, e.g. that a '0' may be output from the latch device when in fact a '1' should be output and vice versa. Alternatively, the common-mode variations may cause a slow down of the time needed for the latch device 1 to settle at a correct output level.

When used in a comparator in an ADC, the susceptibility to common-mode variations in the latch device may limit the effective resolution of the ADC.

SUMMARY OF THE INVENTION

It is an object of the invention to provide a latch device with reduced sensitivity to common-mode variations. It is a further object of the invention to provide a method for compensation of common-mode variations in a latch device.

According to a first aspect, a latch device comprising a first input device in a first branch and a second input device in a second branch further comprises a first estimator unit adapted to generate a first estimate of a current generated by the first input device and a second estimator unit adapted to generate a second estimate of a current generated by the second input device. The latch device further comprises a control-voltage unit operatively connected to the first and the second estimator unit. The control-voltage unit is adapted to generate a control voltage based on a sum of the first estimate and the second estimate. The latch device further comprises a first and a second voltage-controlled current unit adapted to generate currents at least based on the control voltage. The first voltage-controlled current unit is operatively connected to the first branch. The second voltage-controlled current unit is operatively connected to the second branch.

Each of the first input device, the second input device, the first estimator unit, and the second estimator unit may include at least one transistor.

The at least one transistors included in the first input device, the second input device, the first estimator unit, and the second estimator unit may all either be PMOS transistors or NMOS transistors.

Each of the control-voltage unit, the first voltage-controlled current unit, and the second voltage-controlled current unit may include at least one transistor.

The at least one transistors included in the control-voltage unit, the first voltage-controlled current unit, and the second voltage-controlled current unit may all be either NMOS transistors or PMOS transistors.

At least one of the at least one transistor included in the control-voltage unit may be diode connected.

The latch device may include an auto-zero unit adapted to supply a bias voltage for the latch device during an auto-zero phase. The latch device may include at least one cross-coupled pair of transistors. The at least one cross-coupled pair of transistors may be operatively connected to the first and the second input device and the first and the second voltage-controlled current unit.

According to a second aspect, a comparator arrangement comprises the latch device.

According to a third aspect, an analog-to-digital converter comprises the latch device.

According to a fourth aspect, a memory device comprises the latch device.

According to a fifth aspect, an electronic apparatus comprises the latch device. The electronic apparatus may be, but is not limited to, a monitor, a projector, a television set, or a radio transceiver.

According to a sixth aspect, a method for compensation for common-mode variations in a latch device is provided. The method comprises the steps of generating a first estimate of a current generated by a first input device in a first branch of the latch device and generating a second estimate of a current generated by a second input device in a second branch of the latch device. The method further comprises the steps of generating a sum of the first estimate and the second estimate and generating a control voltage based on the sum of the first and the second estimates. Further, the method comprises the step of supplying the control voltage to a first and a second voltage-controlled current unit for controlling the currents generated by the first and the second voltage-controlled current unit.

It is an advantage that the latch device may be relatively insensitive to common-mode fluctuations in voltages input to the latch device. It is a further advantage that this insensitivity may be obtained also in a setting with a low supply voltage.

Further embodiments of the invention are defined in the dependent claims.

It should be emphasized that the term "comprises/comprising" when used in this specification is taken to specify the presence of stated features, integers, steps, or components, but does not preclude the presence or addition of one or more other features, integers, steps, components, or groups thereof.

BRIEF DESCRIPTION OF THE DRAWINGS

Further objects, features and advantages of the invention will appear from the following detailed description of the invention, reference being made to the accompanying drawings, in which.

DETAILED DESCRIPTION OF EMBODIMENTS

Figure 1:
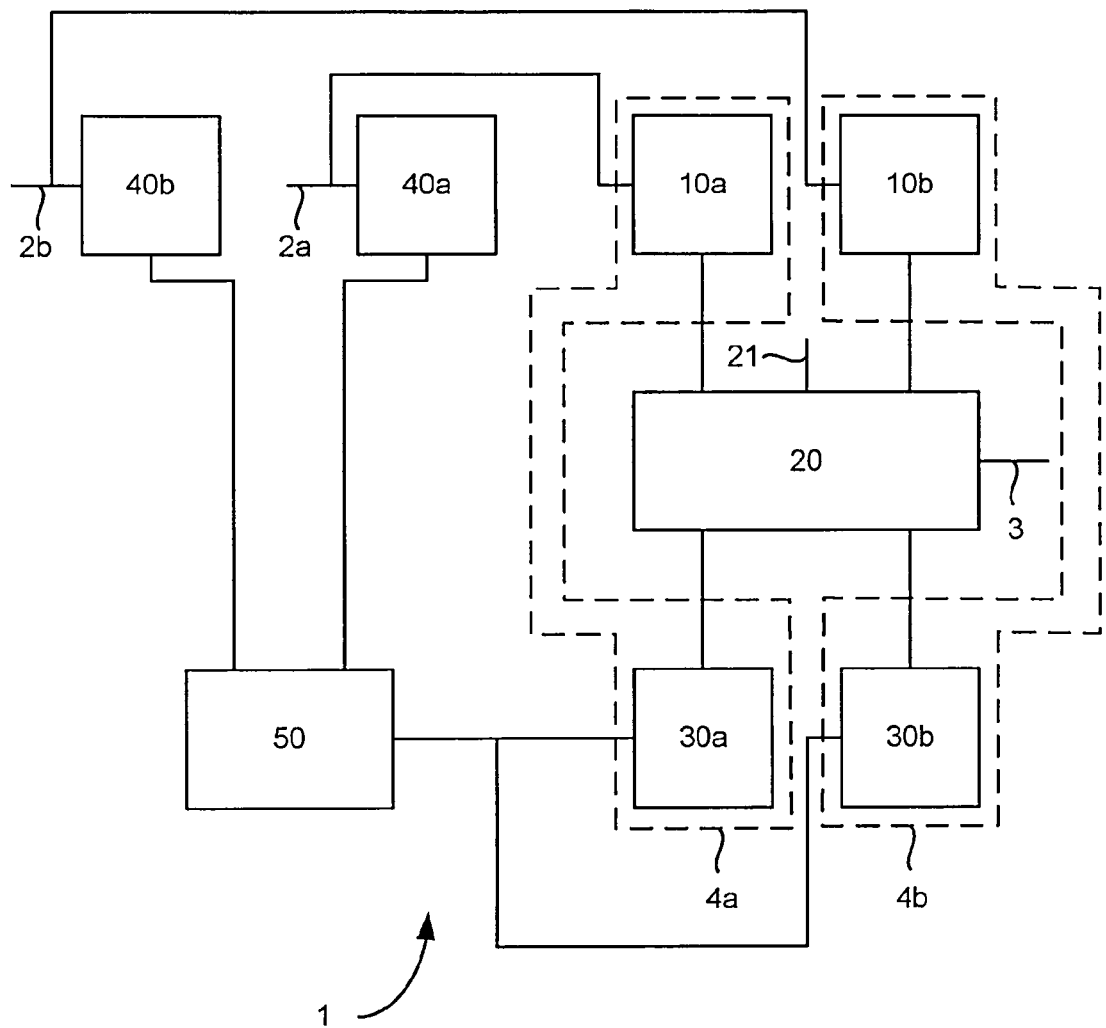
FIG. 1 is a block diagram of a latch device according to an embodiment.

FIG. 1 shows a block diagram of a latch device 1 having a first branch 4a and a second branch 4b according to an embodiment. The first branch 4a may comprise a first input device 10a, which may be connected to a first input terminal 2a of the latch device 1. The second branch 4b may comprise a second input device 10b, which may be connected to a second input terminal 2b of the latch device 1. The latch device 1 may also have an amplification unit 20 operatively connected to the first input device 10a and the second input device 10b. The amplification unit 20 may have a reset terminal 21. The amplification unit 20 may be adapted to balance the first branch 4a and the second branch 4b during a reset phase e.g. based on a reset signal, which may be supplied to the reset terminal 21.

The amplification unit 20 may be adapted to generate an output of the latch device 1 on an output terminal 3 during a latch phase. The generation of the output may be based on an imbalance in electrical conditions between the first branch 4a and the second branch 4b. The imbalance may in turn be caused by a difference between a voltage at the first input terminal 2a and a voltage at the second input terminal 2b.

Fluctuations due to common-mode variations may be reduced by means of a first estimator unit 40a, a second estimator unit 40b, a control-voltage unit 50, a first voltage-controlled current unit 30a and a second voltage-controlled current unit 30b.

For example, the input terminal 2a may be connected to an input of the first estimator unit 40a and to the first input device 10a, as shown in FIG. 1. The first estimator unit 40a may be adapted to generate a first estimate of a current generated by the first input device 10a. Similarly, the input terminal 2b may be connected to an input of the second estimator unit 40b and to the second input device 10b, as shown in FIG. 1. The second estimator unit 40b may be adapted to generate a second estimate of a current generated by the second input device 10b.

Output terminals of the first estimator unit 40a and the second estimator unit 40b may be operatively connected to the control-voltage unit 50. The control-voltage unit 50 may be adapted to generate a control voltage on a control terminal based on a sum of the first estimate and the second estimate generated by the first estimator unit 40a and the second estimator unit 40b, respectively.

The first voltage-controlled current unit 30a may be part of the first branch 4a. The control terminal of the of the control-voltage unit may be operatively connected to an input of the first voltage-controlled current unit 30a. For example, the first voltage-controlled current unit 30a may be adapted to generate a current at least based on the control voltage, e.g. a current proportional to the sum of the first estimate and the second estimate, at least during the reset phase.

Similarly, the second voltage-controlled current unit 30b may be part of the second branch 4b. The control terminal of the control-voltage unit may be operatively connected to an input of the second voltage-controlled current unit 30b. For example, the second voltage-controlled current unit 30b may be adapted to generate a current at least based on the control voltage, e.g. a current proportional to the sum of the first estimate and the second estimate, at least during the reset phase.

Figure 2:
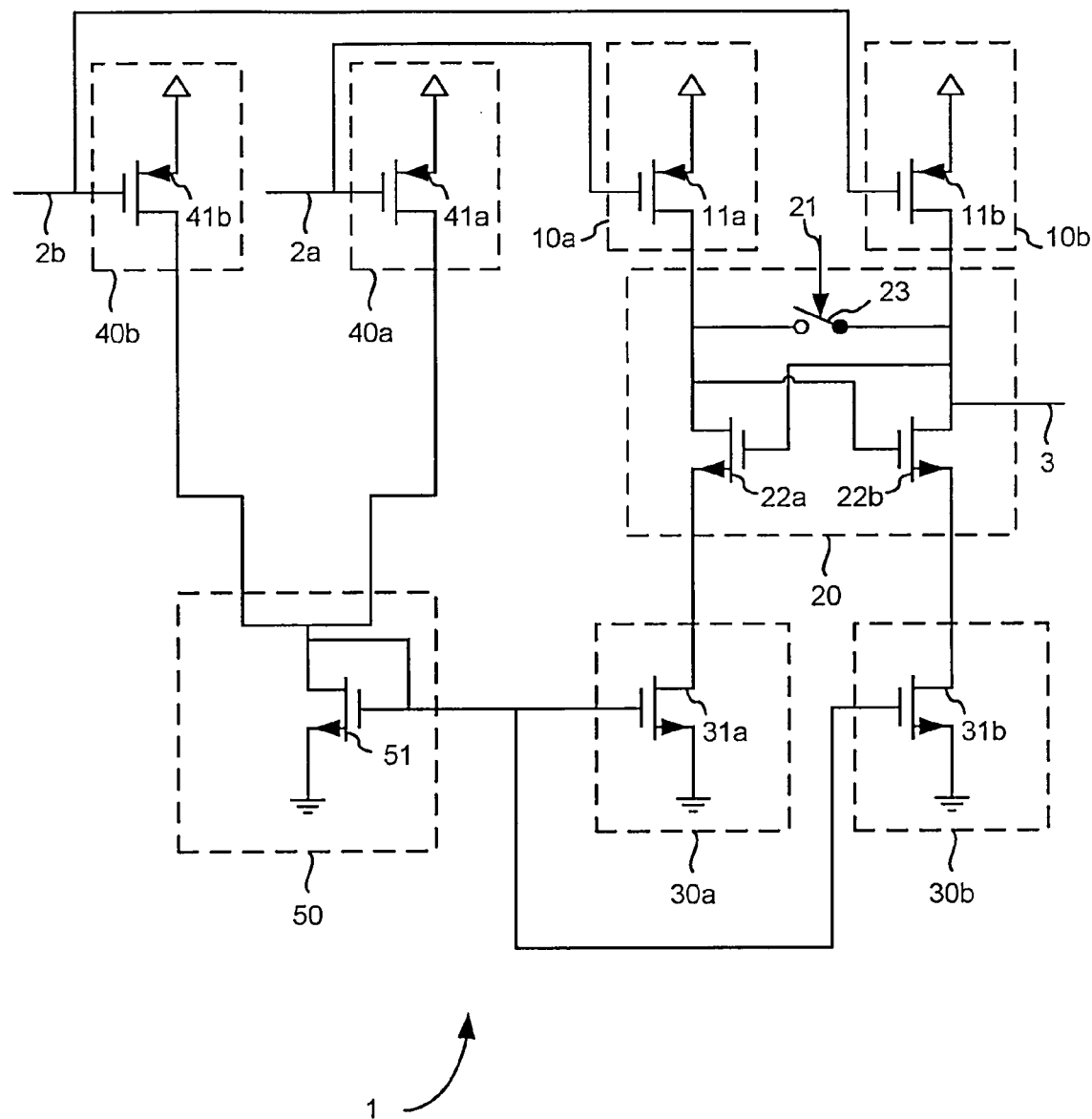
FIG. 2 is a schematic circuit diagram of a latch device according to an embodiment.

A schematic circuit diagram of an embodiment of the latch device 1 is shown in FIG. 2. In the embodiment, the input devices 10a and 10b may be implemented with PMOS transistors 11a and 11b, respectively. The PMOS transistors 11a and 11b may be equally sized. The source terminals of the PMOS transistors 11a and 11b may both be connected to a supply voltage ($V_{DD}$) of the latch device 1. The input terminals 2a and 2b may be connected to the gate terminals of the PMOS transistors 11a and 11b, respectively.

The amplification unit 20 may include a cross-coupled pair of NMOS transistors 22a and 22b. The drain terminals of the NMOS transistors 22a and 22b may be connected to the input devices 10a and 10b, respectively. For example, the drain terminals of the NMOS transistors 22a and 22b may be connected to drain terminals of the PMOS transistors 11a and 11b, respectively. The NMOS transistors 22a and 22b may be equally sized. The amplification unit 20 may further comprise a switch 23, which may be controlled via the reset terminal 21. The switch 23 may be adapted to balance the two branches 4a and 4b when closed, e.g. by setting the electrical potentials at the drain terminals of the NMOS transistors 22a and 22b approximately equal. The switch 23 may e.g. be implemented with a PMOS transistor, an NMOS transistor, or a transmission gate. The output terminal 3 of the latch device 1 may be connected to the drain terminal of the NMOS transistor 22b. Alternatively, a differential output may be used where an additional output terminal (not shown in FIG. 2) of the latch device 1 may be connected to the drain terminal of the NMOS transistor 22a.

The voltage-controlled current units 30a and 30b may include NMOS transistors 31a and 31b, respectively. The source terminals of the NMOS transistors 31a and 31b may both be connected to ground. The drain terminals of the NMOS transistors 31a and 31b may be connected to the amplification unit 20. For example, the drain terminals of the NMOS transistors 31a and 31b may be connected to the source terminals of the NMOS transistors 22a and 22b, respectively. The NMOS transistors 31a and 31b may be equally sized.

The control-voltage unit 50 may include an NMOS transistor 51. The NMOS transistor 51 may be diode connected, i.e. the drain terminal of the NMOS transistor 51 may be connected to the gate terminal of the NMOS transistor 51. The NMOS transistor 51 may be adapted to generate the control voltage of the control-voltage unit at its gate terminal. The gate terminal of the NMOS transistor 51 may be connected to the voltage-controlled current units 30a and 30b, respectively, for supplying the control voltage to the voltage-controlled current units 30a and 30b. For example, the gate terminal of the NMOS transistor 51 may be connected to the gate terminals of the NMOS transistors 31a and 31b.

The estimator units 40a and 40b may include PMOS transistors 41a and 41b, respectively. The source terminals of the PMOS transistors may both be connected to $V_{DD}$. The input terminals 2a and 2b of the latch device 1 may be connected the gate terminals of the PMOS transistors 41a and 41b, respectively. The drain terminals of the PMOS transistors 41a and 41b may be connected to the control-voltage unit 50. For example, the drain terminals of the PMOS transistors 41a and 41b may both be connected to the drain terminal of the NMOS transistor 51. The PMOS transistors 41a and 41b may be equally sized.

The width-over-length ratio (W/L) for the PMOS transistors 41a and 41b may be a factor K times W/L for the PMOS transistors 11a and 11b, where K is a real number. W/L for the NMOS transistor 51 may then be 2K times W/L for the NMOS transistors 31a and 31b. For example, the factor K may be an integer, such as 1, 2, or 4. Alternatively, the factor K may be a rational number, such as ½ or ¼.

A qualitative description of the function of the embodiment of FIG. 2 will be given in the following. As an example, the factor K is set to 1. It is assumed that, initially, the latch device 1 is operating in a reset phase wherein the switch 23 is closed such that the latch device is operating under a balanced condition.

Provided that the two PMOS transistors 11a and 41a are both operating in a saturated mode, they approximately generate the same drain current, since they both have the same source-to-gate voltage ($V_{SG}$). Hence, the drain current of the PMOS transistor 41a is an estimate of the drain current of the PMOS transistor 11a. Similarly, the drain current of the PMOS transistor 41b is an estimate of the drain current of the PMOS transistor 11b. The sum of the drain currents from the PMOS transistors 41a and 41b is generated by connecting the drain terminals of the PMOS transistors 41a and 41b to a common node. This sum of drain currents is injected into the drain terminal of the NMOS transistor 51. The NMOS transistor 51 is configured as an input transistor of a current mirror and hence generates a control voltage such that the NMOS transistors 31a and 31b each has approximately half of the drain current of the NMOS transistor 51. Hence, the circuit arrangement of the latch-device is such that the NMOS transistors 31a and 31b each has a drain current approximately equal to half of the sum of the drain currents from the PMOS transistors 11a and 11b. Thereby, the currents generated by the voltage-controlled current units 30a and 30b are adjusted to compensate for variations in the currents generated by the input devices 10a and 10b. As a result, a stable operating point for the output voltage of the latch device 1 may be obtained even under the influence of common-mode variations.

When the switch 21 is opened, a difference between the voltages supplied to the input terminals 2a and 2b may cause an imbalance between the two branches 4a and 4b. This imbalance may be amplified by the cross-coupled transistor pair 22a and 22b thereby forcing the drain potential of one of the NMOS transistors 22a and 22b close to $V_{DD}$ and the drain potential of the other of the NMOS transistors 22a and 22b close to ground.

Figure 3:
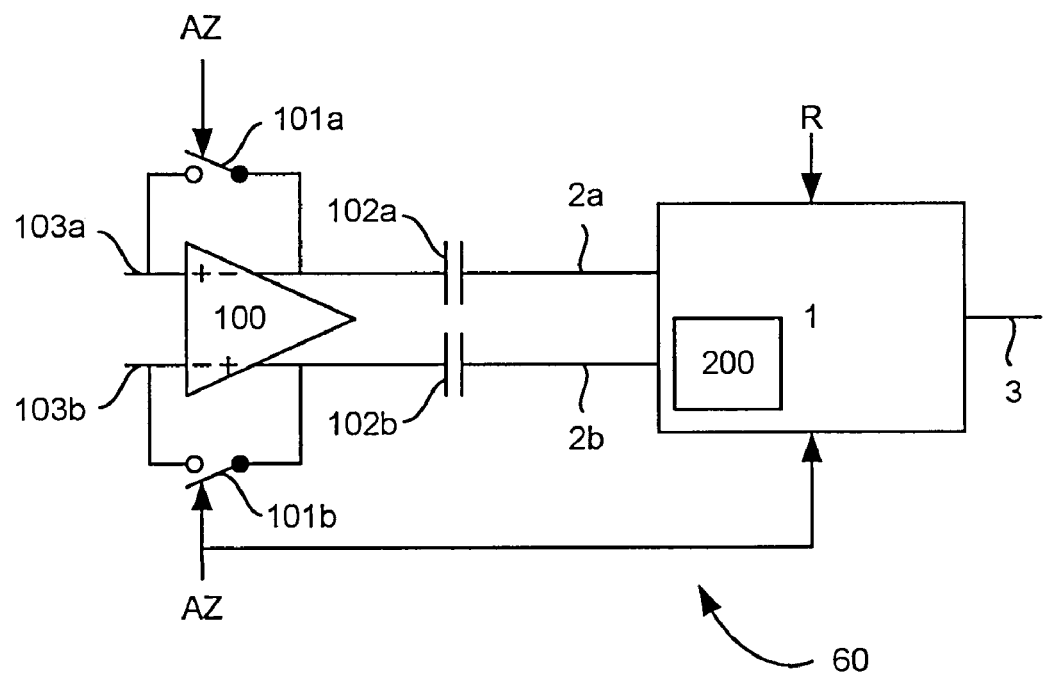
FIG. 3 is a circuit diagram of a comparator arrangement according to an embodiment.

FIG. 3 illustrates an embodiment of a comparator arrangement 60, which may include the latch device 1. The comparator arrangement 60 may be used for detecting which of a first voltage supplied at a terminal 103a and a second voltage supplied at a terminal 103b of the comparator arrangement 60 is the largest. A comparator 100 may be capacitively coupled to the inputs 2a and 2b of the latch device 1 via capacitors 102a and 102b, respectively.

The comparator arrangement 60 may include a switch 101a connected between a positive input and a negative output of the comparator 100 and a switch 101b connected between a negative input and a positive output of the comparator 100. The switches 101a and 101b may e.g. be implemented with NMOS transistors, PMOS transistors, or transmission gates. The switches 101a and 101b may be controlled by an auto-zero signal AZ. The auto-zero signal AZ may determine the duration of an auto-zero phase of the comparator arrangement 60. During the auto-zero phase, the switches 101a and 101b may be closed, forcing all of the positive input, negative input, positive output and negative output of the comparator 100 to a common voltage level.

The latch device 1 may additionally include an auto-zero unit 200. The auto-zero unit 200 may be adapted to supply a bias voltage for the latch device 1 during the auto-zero phase. The auto-zero signal AZ may be supplied to the latch device 1, e.g. for controlling the operation of the auto-zero unit 200. Further, a reset signal R may be supplied to the latch device 1, e.g. for controlling the switch 23 in the amplification unit 20 (FIG. 2).

Figure 4:
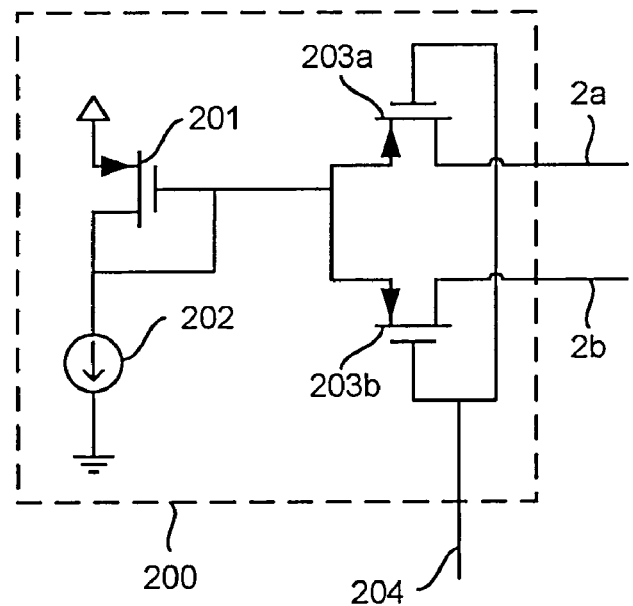
FIG. 4 is a schematic circuit diagram of an auto-zero unit according to an embodiment.

An embodiment of an auto-zero unit 200 that may be used e.g. with the embodiment of the latch device 1 of FIG. 2 is illustrated with a schematic circuit diagram in FIG. 4. A diode-connected PMOS transistor 201 biased with a DC current generated by a current source 202 may be included in the auto-zero unit 200. The PMOS transistor 201 may be adapted to generate a bias voltage for the latch device 1 at its gate terminal. The current source 202 may e.g. be implemented with at least one NMOS transistor. The gate terminal of the PMOS transistor 201 may be connected via PMOS transistors 203a and 203b to the inputs 2a and 2b of the latch device 1, respectively, e.g. for supplying the bias voltage for the latch device 1 during the auto-zero phase. The PMOS transistors 203a and 203b may be controlled via a control terminal 204. For example, the auto-zero signal AZ or a signal derived from the auto-zero signal AZ, such as an inverse or a complement of the auto-zero signal AZ, may be supplied to the control terminal 204.

Figure 5:
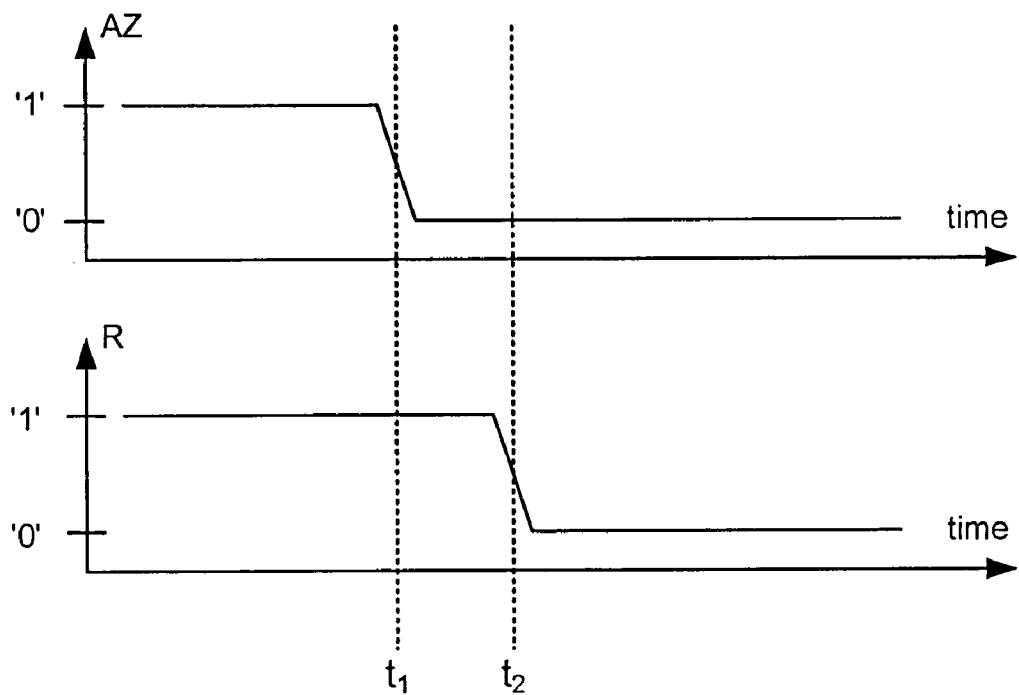
FIG. 5 show waveform diagrams for controlling the comparator arrangement of FIG. 3 according to an embodiment.

FIG. 5 shows examples of waveforms for the auto-zero signal AZ and the reset signal R that may be used for controlling the comparator arrangement 60 of FIG. 3. The waveforms shown in FIG. 5 start during an auto-zero phase. Both AZ and R start at a first voltage level corresponding to a logic '1'. The first voltage level may e.g. be $V_{DD}$. In an example embodiment, the switches 101a and 101b may be such that they are both closed when a logic '1' is supplied by the auto-zero signal AZ. Further, the switch 23 (FIG. 2) of the latch device 1 may be such that it is closed when a logic '1' is supplied by the reset signal R. The auto-zero unit 200 may be adapted to supply a bias voltage for the latch device 1 when a logic '1' is supplied by the auto-zero signal AZ. In an embodiment utilizing the auto-zero unit of FIG. 4, the PMOS transistors 203a and 203b may be conducting when a logic '1' is supplied by the auto-zero signal AZ. For example, the inverse or complement of the auto-zero signal AZ may be supplied to the terminal 204.

At a first time instant $t_1$, the auto-zero phase is ended and AZ may make a transition to a second voltage level corresponding to a logic '0'. The second voltage level may be e.g. be 0 V. R remains at the first voltage level. The switches 101a and 101b may be opened and the PMOS transistors 203a and 203b may be set in a nonconducting state. When this happens, the common-mode level of the positive and negative output of the comparator 100 may fluctuate. The fluctuations may e.g. be in the order of 100 mV. Since the inputs 2a and 2b of the latch device 1 are no longer actively driven by the auto-zero unit 200, the fluctuation of the common-mode level may be transferred to the inputs 2a and 2b of the latch device due to the capacitive coupling provided by the capacitors 102a and 102b. Due to the compensation provided by the estimator units 40a and 40b, the control-voltage unit 50, and the voltage-controlled current units 30a and 30b (FIGS. 1 and 2), the operating point of the output of the latch device 1 may remain stable even under the influence of such common-mode fluctuations. In known latch devices, these types of common mode fluctuation may cause erroneous results or increase the settling time, specifically in settings with low supply voltage. It is an advantage of the embodiments of the latch device 1 described herein that they are relatively insensitive to common-mode fluctuations also in settings with low supply voltages.

At a second time instant $t_2$, which may occur after $t_1$, R may make a transition to the second voltage level. The switch 23 in the amplification unit 20 of the latch device 1 may then be opened, allowing for the amplification unit 20 to amplify an imbalance between the two branches 4a and 4b.

An alternative embodiment to the embodiment of FIG. 2 may be obtained by replacing all NMOS transistors with PMOS transistors, replacing all PMOS transistors with NMOS transistors, replacing all connections to ground with connections to $V_{DD}$, and replacing all connections to $V_{DD}$ with connections to ground.

In further alternative embodiments, more than one cross-coupled transistor pair may be included in the amplification unit. For example, a cross-coupled PMOS pair may be used in addition to the cross-coupled NMOS pair 22a, 22b.

In the presented embodiments, the latch device has been implemented using MOS transistors. Embodiments using other types of transistors, e.g., bipolar junction transistors (BJTs) are also possible within the scope of the invention.

The latch device 1 may be used e.g. in a comparator arrangement, such as that discussed in the context of FIG. 3. The latch device 1 and/or the comparator arrangement may be included in an ADC. The ADC may be, but is not limited to, any of a time-interleaved ADC, a successive approximation ADC, a parallel successive approximation ADC, a flash ADC, or a pipelined ADC. Using the latch device 1 in an ADC may be advantageous for obtaining a relatively high effective resolution of the ADC.

The latch device 1 may alternatively be used in other contexts where sensing of a voltage difference is needed. For example, the latch device 1 may be operable as a sense amplifier in a memory device. Using the latch device 1 as a sense amplifier in the memory device may provide a reduced probability for read errors due to common-mode fluctuations in the memory device. The memory device may e.g. be a static random-access memory (SRAM), a dynamic random-access memory (DRAM), a mask-programmed read-only memory (ROM), etc.

The latch device may be comprised in an integrated circuit. The latch device may further be comprised in an electronic apparatus, such as but not limited to a monitor, such as a VGA monitor, a projector, a television set, or a radio transceiver.

Figure 6:
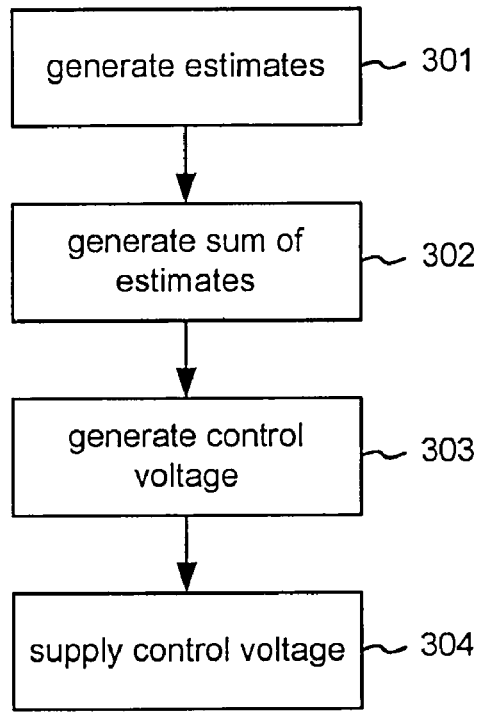
FIG. 6 is a flow chart for a method for compensation for common-mode variations in a latch device according to an embodiment.

FIG. 6 shows a flow chart for a method for compensation for common-mode variations in the latch device 1. The method may comprise the step 301 of generating a first estimate of the current generated by the first input device 10a and generating a second estimate of the current generated by the second input device 10b. The method may additionally comprise the step 302 of generating a sum of the first estimate and the second estimate and the step 303 of generating the control voltage for the first and second voltage-controlled current units 30a and 30b based on the sum of the first estimate and the second estimate. In a further step 304, the control voltage may be supplied to the first and the second voltage-controlled current units 30a and 30b for controlling the currents generated by the first and the second voltage-controlled current unit 30a and 30b.

The present invention has been described above with reference to specific embodiments. However, other embodiments than the above described are possible within the scope of the invention. Different method steps than those described above, performing the method by hardware or software, may be provided within the scope of the invention. The different features and steps of the invention may be combined in other combinations than those described. The scope of the invention is only limited by the appended patent claims.

The invention claimed is:

1. A latch device for connection, in a comparator arrangement, to a comparator via capacitors between output terminals of the comparator and a first and a second input terminal of the latch device, comprising:
   a first input device in a first branch and a second input device in a second branch, wherein
   a first estimator unit adapted to generate a first estimate of a current generated by the first input device;
   a second estimator unit adapted to generate a second estimate of a current generated by the second input device;
   a control-voltage unit operatively connected to the first estimator unit and to the second estimator unit, wherein the control-voltage unit is adapted to generate a control voltage based on a sum of the first estimate and the second estimate;
   a first and a second voltage-controlled current unit adapted to generate currents at least based on the control voltage, wherein the first voltage-controlled current unit is operatively connected to the first branch and the second voltage-controlled current unit is operatively connected to the second branch; and
   an auto-zero unit adapted to supply a bias voltage to the input terminals of the latch device during an auto-zero phase.

2. The latch device according to claim 1, wherein the auto-zero unit comprises a diode-connected MOS transistor arranged to be biased with a DC current and to generate the bias voltage on its gate terminal.

3. The latch device according to claim 2, wherein the auto-zero unit comprises a first switch MOS transistor connected between the gate terminal of the diode-connected MOS transistor and the first input terminal of the latch device and a second switch MOS transistor connected between the gate terminal of the diode-connected MOS transistor and the second input terminal of the latch device, wherein the first and second switch MOS transistors are arranged to be conducting during the auto-zero phase for supplying the bias voltage to the input terminals during the auto-zero phase.

4. The latch device according to claim 1, wherein each of the first input device, the second input device, the first estimator unit, and the second estimator unit include at least one transistor.

5. The latch device according to claim 4, wherein the at least one transistors included in the first input device, the second input device, the first estimator unit, and the second estimator unit are all either PMOS transistors or NMOS transistors.

6. The latch device according to claim 5, wherein the gate terminals of the transistors of the first input device and the first estimator unit are connected to the first input terminal of the latch device, the gate terminals of the transistors of the second input device and the second estimator unit are connected to the second input terminal of the latch device, and the source terminals of the transistors of the first and second input devices and the first and second estimator units are connected to:
- a supply-voltage node if the transistors are PMOS transistors; or
- a ground node if the transistors are NMOS transistors.

7. The latch device according to claim 1, wherein each of the control-voltage unit, the first voltage-controlled current unit, and the second voltage-controlled current unit include at least one transistor.

8. The latch device according to claim 7, wherein at least one transistors included in the control-voltage unit, the first voltage-controlled current unit, and the second voltage-controlled current unit are all either NMOS transistors or PMOS transistors.

9. The latch device according to claim 7, wherein at least one of the transistor included in the control-voltage unit is diode connected.

10. The latch device according to claim 1, wherein the latch device includes at least one cross-coupled pair of transistors operatively connected to the first and the second input device and the first and the second voltage-controlled current unit.

11. The latch device according to claim 1, wherein
the first input device comprises an MOS transistor of a first type connected to the first input terminal with its gate terminal and to a first node with its source terminal;
the second input device comprises an MOS transistor of the first type connected to the second input terminal with its gate terminal and to the first node with its source terminal;
the first estimator unit comprises an MOS transistor of the first type connected to the first input terminal with its gate terminal and to the first node with its source terminal;
the second estimator unit comprises an MOS transistor of the first type connected to the second input terminal with its gate terminal and to the first node with its source terminal;
the control-voltage unit comprises a diode-connected MOS transistor of a second type connected to the drain terminals of the MOS transistors of the first and second estimator units with its gate terminal and to a second node with its source terminal; and
the first and second voltage-controlled current units each comprises an MOS transistor of the second type connected to the gate terminal of the MOS transistor of the control-voltage unit with their gate terminals and to the second node with their source terminals; and
wherein the latch device comprises:
a cross-coupled pair of MOS transistor of the second type, wherein a first MOS transistor of the cross-coupled pair is connected to the drain terminal of the MOS transistor of the first input device with its drain terminal and to the drain terminal of the MOS transistor of the first voltage-controlled current unit with its source terminal, and a second MOS transistor of the cross-coupled pair is connected to the drain terminal of the MOS transistor of the first input device with its drain terminal and to the drain terminal of the MOS transistor of the first voltage-controlled current unit with its source terminal; and
a switch connected between the drain terminals of the MOS transistors of the cross-coupled pair;
wherein either
the first node is a supply-voltage node, the second node is a ground node, the first MOS transistor type is PMOS, and the second MOS transistor type is NMOS; or
the first node is a ground node, the second node is a supply-voltage node, the first MOS transistor type is NMOS, and the second MOS transistor type is PMOS.

12. A comparator arrangement comprising a latch device according to claim 1.

13. The comparator arrangement according to claim 12, comprising:
a comparator having a first and a second input terminal and a first and a second output terminal;
a first capacitor connected between the first output terminal of the comparator and the first input terminal of the latch device; and
a second capacitor connected between the second output terminal of the comparator and the second output terminal of the latch device.

14. The comparator arrangement according to claim 13, comprising a first switch connected between the first input terminal and the first output terminal of the comparator and a second switch connected between the second input terminal and the second output terminal of the comparator, wherein the first and the second switch are arranged to be closed during the auto-zero phase.

15. An analog-to-digital converter comprising a latch device according to claim 1.

16. A memory device comprising a latch device according to claim 1.

17. An electronic apparatus comprising a latch device according to claim 1.

18. The electronic apparatus according to claim 17, wherein the electronic apparatus is a monitor, a projector, a television set, or a radio transceiver.

19. A method for compensation for common-mode variations in a latch device, wherein the latch device is adapted for connection, in a comparator arrangement, to a comparator via capacitors between output terminals of the comparator and a first and a second input terminal of the latch device, wherein
generating a first estimate of a current generated by a first input device in a first branch of the latch device;
generating a second estimate of a current generated by a second input device in a second branch of the latch device;
generating a sum of the first estimate and the second estimate;
generating a control voltage based on the sum of the first and the second estimates;
supplying the control voltage to a first and a second voltage-controlled current unit for controlling the currents generated by the first and the second voltage-controlled current unit; and
supplying a bias voltage from an auto-zero unit to the input terminals of the latch device during an auto-zero phase.

* * * * *